(12) United States Patent
Romero et al.

(10) Patent No.: US 8,324,549 B2
(45) Date of Patent: Dec. 4, 2012

(54) DETECTOR FOR DETECTING ELECTROMAGNETIC RADIATION HAVING DOPANT CONCENTRATION OF A WELL INCREASES MONOTONICALLY IN THE DIRECTION PARALLEL TO THE SURFACE OF A SEMICONDUCTOR SUBSTRATE

(75) Inventors: Daniel Durini Romero, Essen (DE); Werner Brockherde, Duisberg (DE); Bedrich Hosticka, Muehlheim a.d.R (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 392 days.

(21) Appl. No.: 12/775,204

(22) Filed: May 6, 2010

(65) Prior Publication Data

US 2010/0308213 A1    Dec. 9, 2010

(30) Foreign Application Priority Data

May 7, 2009   (DE) .......................... 10 2009 020 218

(51) Int. Cl.
*H01J 27/00*   (2006.01)
(52) U.S. Cl. .................. 250/208.1; 250/214 R
(58) Field of Classification Search ............... 250/208.1, 250/214 R, 239; 257/290–292, 121, 187; 438/66–73, 174, 276
See application file for complete search history.

(56) References Cited

U.S. PATENT DOCUMENTS

| 4,245,233 | A | 1/1981 | Lohstroh |
| 5,705,836 | A | 1/1998 | Agwani et al. |
| 5,903,021 | A | 5/1999 | Lee et al. |
| 7,087,944 | B2 * | 8/2006 | Rhodes et al. ................. 257/292 |
| 7,391,066 | B2 | 6/2008 | Rhodes |
| 2004/0253761 | A1 | 12/2004 | Rhodes et al. |
| 2007/0096159 | A1 | 5/2007 | Kudou |

* cited by examiner

*Primary Examiner* — Que T Le
(74) *Attorney, Agent, or Firm* — Michael A. Glenn; Glenn Patent Group

(57) ABSTRACT

A detector for detecting electromagnetic radiation includes a semiconductor substrate of a first doping type, and a well in the semiconductor substrate, the well being of a second doping type. The first doping type and the second doping type are different and the well has an increasing dopant concentration in a direction parallel to a surface of the semiconductor substrate. In addition, the detector includes a detector terminal doping region which is arranged at least partly in the well in a terminal region of the well. The detection of electromagnetic radiation is based on a generation of free charge carriers by the electromagnetic radiation in a detection region of the well. The detection region has a maximum dopant concentration which is lower than a maximum dopant concentration of the terminal region of the well.

9 Claims, 8 Drawing Sheets

600

Generating free charge carriers by the electromagnetic radiation in a detection region of a well, the well being arranged in a semiconductor substrate, the semiconductor substrate being of a first doping type and the well being of a second doping type, the first doping type and the second doping type being different, wherein the well comprises an increasing dopant concentration in a direction parallel to a surface of the semiconductor substrate, and wherein the detection region of the well comprises a maximum dopant concentration which is lower than a maximum dopant concentration of a terminal region of the well.

610 collecting the free charge carriers in a detector terminal doping region which is arranged at least partly in the well in the terminal region of the well, the detector terminal doping region being of the same doping type as the well, wherein detecting the electromagnetic radiation is based on collecting the free charge carriers

DETECTOR FOR DETECTING ELECTROMAGNETIC RADIATION HAVING DOPANT CONCENTRATION OF A WELL INCREASES MONOTONICALLY IN THE DIRECTION PARALLEL TO THE SURFACE OF A SEMICONDUCTOR SUBSTRATE

CROSS-REFERENCE TO RELATED APPLICATION

This application claims priority from German Patent Application No. 102009020218.8, which was filed on May 7, 2009, and is incorporated herein by reference in its entirety.

BACKGROUND OF THE INVENTION

Embodiments in accordance with the invention relate to optical sensors and image devices and, in particular, to a detector for detecting electromagnetic radiation and to a method for detecting electromagnetic radiation, and to a method for producing a detector.

Optical sensors and image devices are important objects in many fields of everyday life. In consumer applications, such as, for example, digital photography and mobile phone cameras, simple image devices have gone into industrial mass production. Nevertheless, there is a huge market potential for special image devices, like for example in the fields of monitoring or in industry, medicine, in the field of motor vehicles and in scientific applications.

Within these fields, there is a great diversity of application-related requirements which are still the object of active research, such as, for example, highly sensitive sensors for operating under poor light conditions, infrared cameras, 3D cameras providing distance information in the image, or high-speed cameras, all of which are combined with the requirement of cost efficiency and reliability.

In order to address the diversity of requirements for many different applications, very large versatility and flexibility are needed in both technologies and design topics, in particular when the image devices are exemplarily to be generated in CMOS (Complementary Metal Oxide Semiconductor) technologies, which allows in-pixel signal processing, x-y-pixel addressing possibilities, the "camera-on-chip" approach and low cost compared to other solid-body imaging technologies. For 3D type-of-flight measurements or applications for machine vision, typically large-area low-noise high-speed photodetectors are needed. In this type of application, the number of pixels of a sensor or the miniaturization thereof is not the main focus.

The development of pixel configurations using active photo control electrodes (photo gates, PGs), produced in CMOS technology in a "camera-on-chip" approach, started in the early 1990s based on the known and fully-developed CCD (charge couple device) technology. Although these were not new, using same allowed for the development of a wide range of different CMOS image sensor configurations over the years, as was the case before with the p-n junction-based photodiodes. The PG-active pixels based on CMOS technology offer several advantages compared to conventional pixels based on p-n junction photodiodes. The main advantage is improved noise suppression caused by the non-destructive readout thereof. The kTC noise at the pixel output here is not dependent on the capacity of the photodetector. It is defined by the much smaller capacity of the readout node, the so-called floating diffusion (FD) which is charged-coupled to the PG by a MOS capacity-based control electrode (transfer gate, TG). When there are a separate photo-active region and a readout node region, this allows integrated charge readout of the floating diffusion (FD), whereas additionally charge-to-voltage conversion and amplification may be performed. Nevertheless, using a polysilicon layer over the photo-active region reduces its quantum efficiency, in particular in the blue and ultra-violet ranges of the spectrum.

On the other hand, the pixel filling factor decreases with an increasing complexity in the pixel structure. Thus, a compromise has to be found. As an example of application, the photodetectors in a time-of-flight (ToF) 3D imaging application are to be highly sensitive, in particular in the near infrared range (NIR) of the spectrum, the signal-to-noise ratio (SNR) thereof is to be very high (the pixel noise is to be minimized), and the response speed of a pixel also is to be high, in particular when measurements are performed using laser pulses, the pulse periods exemplarily being $T_{Laser} \cong 100$ ns.

Two types of currents are to be taken into consideration when analyzing the speed performance of the PG-based pixel structure: drift and diffusion currents which are induced by a charge transfer from the photo control electrode or gate (PG) to the floating diffusion (FD) via the transfer control electrode or gate (TG). An electrical drift field under the photo gate and the transfer gate allow collected photo-generated charge carriers to be transferred, however, only when there is an electrostatic potential gradient which generates a drift field. For longer photo gates (PGs), the electrostatic potential under the photo gate remains constant, which means that the minority carriers which are collected under the photo gate, can only be transported to the floating diffusion (FD) by means of thermal diffusion, which makes transport very slow. The transfer and readout times of roughly 20 µs are normally achieved in this type of photodetectors using short integration times of 5 µs.

FIG. 7 shows a schematic illustration of a known detector 700 comprising a photo control electrode gate (PG) 710, a transfer control electrode or gate (TG) 720 and a floating diffusion (FD) 730. Additionally, a readout circuit and a reset control electrode (RST) are indicated. Correspondingly, FIG. 8 shows a schematic illustration of an oscilloscope graph 800 of signals of the detector of FIG. 7. The oscilloscope graph 800 shows the reset, PG and TG signals and the voltages at the source follower output under illuminated ($\lambda$=700 nm, E=1.69 $e^{-3}$ W/m²) and dark conditions.

On the other hand, using p-n junction-based photodiodes generates a relatively large amount of equivalent noise charge (ENC) in the photodetector due to its relatively high capacity compared to the previously defined floating diffusion (FD), and the collected charge in these types of applications is held at the silicon surface where an additional noise portion is added to the signal charge. Furthermore, no suitable CDS (correlated double sampling) techniques can be applied in this kind of structure since the charge collecting and readout regions are united here. This kind of application results in unacceptable signal-to-noise ratio numbers.

The so-called "buried" photodiodes and "buried" photo control electrodes or gates are, as has been proven, a good solution for reducing the amount of noise in a photodetector, since the electrostatic potential maximum in these photodetectors is pushed away from the silicon surface, however, they still exhibit problems as far as response speed and overall well capacity are concerned.

SUMMARY

According to an embodiment, a detector for detecting electromagnetic radiation may have a semiconductor substrate of a first doping type, and a well in the semiconductor substrate, the well being of a second doping type. The first doping type and the second doping type are different and the well has an increasing dopant concentration in a direction parallel to a surface of the semiconductor substrate. Furthermore, the detector includes a detector terminal doping region which is arranged at least partly in the well in a terminal region of the well, the detector terminal doping region being of the same doping type as the well. Detecting electromagnetic radiation is based on generating free charge carriers by the electromagnetic radiation in a detection region of the well. The detection region has a maximum dopant concentration which is lower than a maximum dopant concentration of the terminal region of the well, wherein the dopant concentration of the well increases monotonically in the direction parallel to the surface of the semiconductor substrate in a region between one end of the detection region facing away from the terminal region and one end of the terminal region facing away from the detection region. Additionally, the detector may have a transfer control electrode for controlling a transfer of free charge carriers in a region of the well, the transfer control electrode being arranged on the surface of the semiconductor substrate in a region of the well between the detector terminal doping region and the detection region, an electrically insulting layer being arranged between the semiconductor substrate and the transfer control electrode, and a collection control electrode for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

According to another embodiment, a method for producing a detector may have the steps of providing a semiconductor substrate of a first doping type, and generating a well in the semiconductor substrate, the well being of a second doping type. The first doping type and the second doping types are different and the well has an increasing dopant concentration in a direction parallel to a surface of the semiconductor substrate. Furthermore, the method may have the step of generating a detector terminal doping region which is arranged at least partly in the well in a terminal region of the well, the detector terminal doping region being of the same doping type as the well. The detector terminal doping region has a maximum dopant concentration, which is lower than a maximum dopant concentration of the terminal region of the well, wherein the dopant concentration of the well increases monotonically in the direction parallel to the surface of the semiconductor substrate in a region between one end of the detection region facing away from the terminal region and one end of the terminal region facing away from the detection region. Additionally the method may have the steps of generating a transfer control electrode for controlling a transfer of free charge carriers in a region of the well, the transfer control electrode being arranged on the surface of the semiconductor substrate in a region of the well between the detector terminal doping region and the detection region, an electrically insulting layer being arranged between the semiconductor substrate and the transfer control electrode, and generating a collection control electrode for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

According to still another embodiment, a method for detecting electromagnetic radiation may have the step of generating free charge carriers by the electromagnetic radiation in a detection region of a well, the well being arranged in a semiconductor substrate. The semiconductor substrate is of a first doping type and the well is of a second doping type. The first doping type and the second doping type are different and the well has an increasing dopant concentration in a direction parallel to a surface of a semiconductor substrate. The detection region of the well has a maximum dopant concentration which is lower than a maximum dopant concentration of a terminal region of the well. Additionally, the method may have the step of collecting the free charge carriers in a detector terminal doping region which is arranged at least partly in the well in the terminal region of the well, the detector terminal doping region being of the same doping type as the well. Detecting electromagnetic radiation is based on collecting free charge carriers, wherein the dopant concentration of the well increases monotonically in the direction parallel to the surface of the semiconductor substrate in a region between one end of the detection region facing away from the terminal region and one end of the terminal region facing away from the detection region, wherein a transfer control electrode is configured for controlling a transfer of free charge carriers in a region of the well, the transfer control electrode being arranged on the surface of the semiconductor substrate in a region of the well between the detector terminal doping region and the detection region, an electrically insulting layer being arranged between the semiconductor substrate and the transfer control electrode, and wherein a collection control electrode is configured for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

Another embodiment may have a computer program having a program code for performing the method for producing a detector or the method for detecting electromagnetic radiation mentioned above, when the computer program runs on a computer or microcontroller Embodiments in accordance with the invention are based on the basic idea that a drift field which accelerates the charge carriers in the direction to higher dopant concentrations is generated for the free charge carriers by the laterally increasing dopant concentration of the well. Thus, even without applying external electrical potentials, the free charge carriers can be induced to move in a desired direction. This movement may, of course, be supported by applying external electrical potentials. A drift field which may, exemplarily also in detectors of large detection regions, accelerated charges in the entire detection region can be generated by the doping gradient in the well. Thus, the charge carrier transport is no longer restricted to thermal diffusion and may thus take place considerably faster. The response speed of the detector can be increased significantly and/or the response time can be reduced by this.

Some embodiments in accordance with the invention achieve the object of allowing fast response speed and/or short response time and at the same time providing a good signal-to-noise ratio (SNR).

BRIEF DESCRIPTION OF THE DRAWINGS

Embodiments in accordance with the invention will be detailed subsequently referring to the appended drawings, in which:

FIG. 4a shows a schematic illustration of an electrostatic potential profile over a wafer at the collecting control electrode or gate (CG) or the well;

FIG. 4b shows a schematic illustration of an electrostatic potential profile parallel to the substrate surface along a cross section a-a' of FIG. 4a;

FIG. 6 shows a flow chart of a method for detecting electromagnetic radiation;

DETAILED DESCRIPTION OF THE INVENTION

Figure 1:
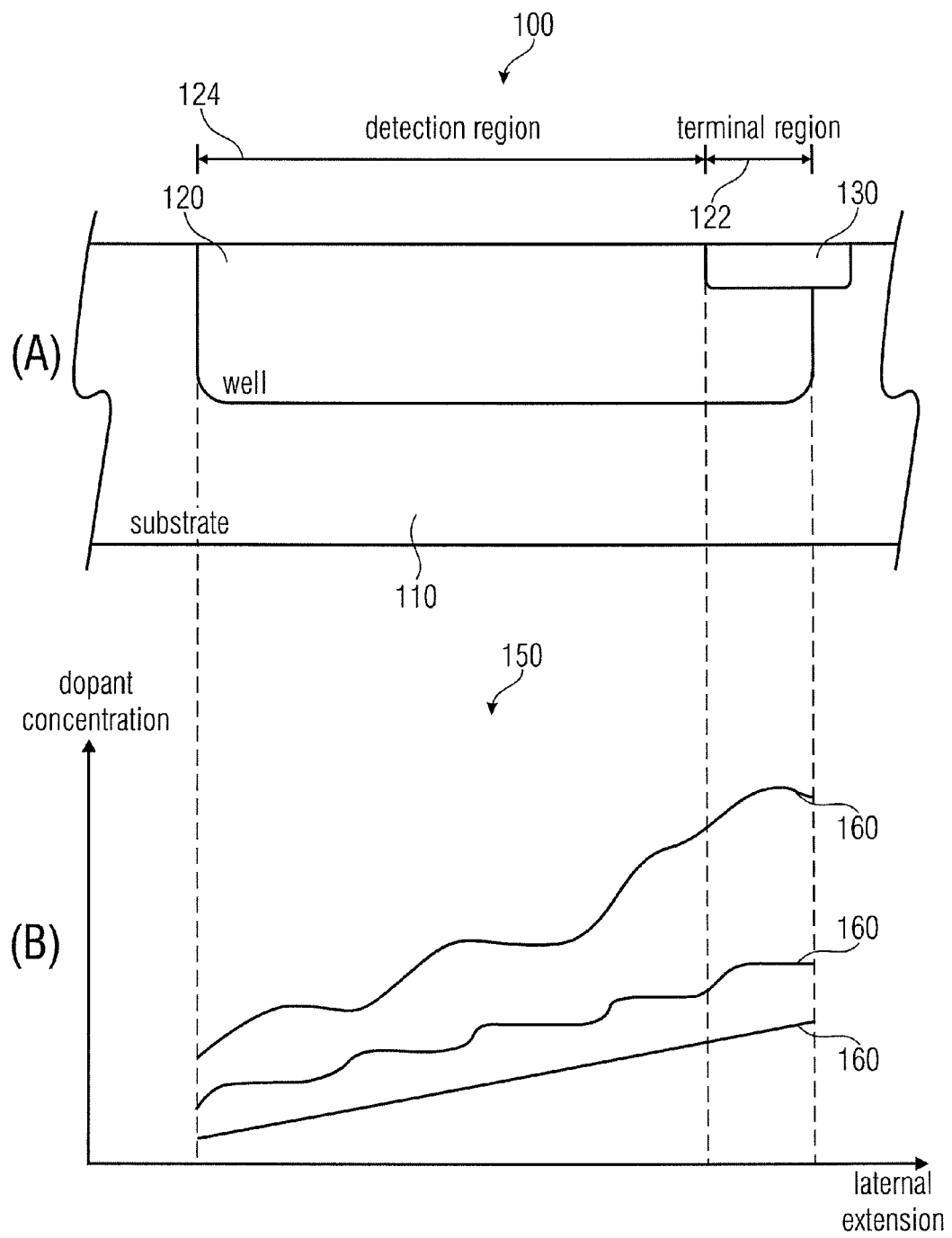
FIG. 1a shows a schematic illustration of a detector for detecting electromagnetic radiation.
FIG. 1b shows a schematic illustration of a lateral dopant concentration course.

In the present application, same reference numerals will be used partly for objects and functional units having the same or similar functional features.

FIG. 1a shows a schematic illustration of a detector 100 for detecting electromagnetic radiation in correspondence with an embodiment in accordance with the invention. The detector 100 includes a semiconductor substrate 110 of a first doping type, and a well 120 in the semiconductor substrate 110, the well 120 being of a second doping type. The first doping type and the second doping type are different and the well 120 comprises an increasing dopant concentration in a direction parallel to a surface of the semiconductor substrate 110. Additionally, the detector 100 includes a detector terminal doping region 130 which is arranged at least partly in the well in a terminal region 122 of the well 120, the detector terminal doping region 130 being of the same doping type as the well 120. Detecting the electromagnetic radiation is based on generating free charge carriers by the electromagnetic radiation in a detection region 124 of the well 120. The detection region 124 comprises a maximum dopant concentration which is lower than a maximum dopant concentration of the terminal region 122 of the well 120.

The detector terminal doping region 130 may be located completely or, as is shown in the figure, partly in the well 120. That part of the well 120 overlapped by the detector terminal doping region 130 is called the terminal region 122 of the well. The detection region 124 may, as is shown, abut directly on the terminal region 122 or be in a lateral distance to the terminal region 122.

The doping type may be either an n-type doping or a p-type doping, depending on the kind of dopant used.

Free charge carriers may form by an interaction of the radiation to be detected and the doped semiconductor material in the detection region of the well. Exemplarily, pairs of charged carriers may be generated, wherein, depending on the doping of the well, the negatively charged electrons or the positively charged holes move along the drift field induced by the increasing dopant concentration in the direction of the detector terminal doping region 130.

Free charge carriers in the well 120 are accelerated by the doping gradient in the well 120 in the direction of an increasing dopant concentration. Depending on the type of doping of the well 120, we talk about negative electrons or positive holes. Due to the drift field, the free charge carriers can be transported considerably faster in the direction of the detector terminal doping region 130 than by pure thermal diffusion. Thus, compared to known detectors, the response speed of the detector may be increased considerably with an equal area of the photoactive region or the detection region may be increased considerably with equal response speed of the detector, in order to increase the detector's sensitivity.

The response speed may exemplarily relate to how fast a detector, after generating free charge carriers by the radiation to be detected, allows a detection result (such as, for example, a signal indicating radiation detection) to be determined. The respective duration may be referred to as response time. The response time of a detector may thus be reduced considerably by the concept described.

The response speed of the detector 100, for example, may be increased considerably compared to, for example, detectors having buried photodiodes and buried photo control electrodes or gates or surface (channel) detectors where the electrostatic potential is constant over the photo-active region.

The detector terminal doping region 130 may exemplarily be connected to an evaluating circuit or a readout circuit. This may exemplarily be realized on the same semiconductor substrate.

The semiconductor substrate 110 may comprise a plurality of equal or, exemplarily, differently sized detectors which may exemplarily be arranged as a matrix or irregularly.

The semiconductor substrate 110 may exemplarily be a silicon wafer, an SOI (silicon on insulator) wafer, a gallium arsenide substrate, an epitaxial layer or another semiconductor substrate. Subsequently, the general semiconductor substrate 110 will also be referred to as silicon substrate, which represents one embodiment. However, it may also be another semiconductor substrate, as needed.

Matching FIG. 1a, FIG. 1b shows a schematic illustration 150 of a dopant concentration course. The abscissa represents lateral extension parallel to the surface of the semiconductor substrate 110 and the ordinate represents the dopant concentration of the well 120. The figures shows three examples of a dopant concentration course 160 in the well. The dopant concentration may exemplarily be monotonically increasing, increasing in a stepped manner, linearly increasing or be of another increasing form. The dopant concentration may exemplarily be the lowest at one end of the well 120 and be the highest at another end of the well 120 where there may exemplarily also be the terminal region 122. Alternatively, the terminal region 122 may exemplarily be located in the center of the well 120 and the dopant concentration may increase from the edges of the well 120 towards the terminal region in the center of the well 120.

The detector terminal doping region 130 may exemplarily exhibit a higher dopant concentration than a maximum dopant concentration of the well 120 in order to allow a low-resistance connection to a wiring plane and, at the same time, offer the greatest electrostatic potential for collecting the free charge carriers. Furthermore, the well 120 may exhibit the maximum dopant concentration of the well in the terminal region 122.

Figure 2:
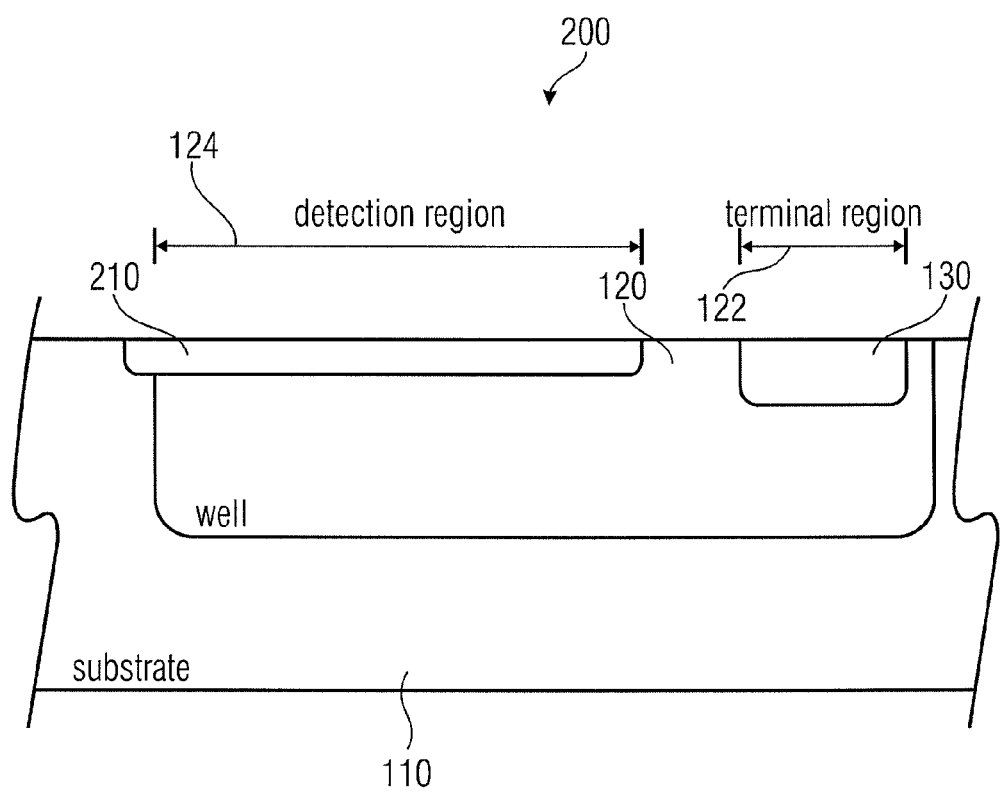
FIG. 2 shows a schematic illustration of a detector for detecting electromagnetic radiation.

FIG. 2 shows a schematic illustration of a detector 200 for detecting electromagnetic radiation in correspondence with an embodiment in accordance with the invention. The setup of the detector 200 corresponds in principle to the detector shown in FIG. 1a, however, comprises an additional surface layer 210. The surface layer 210 is arranged on the surface of the semiconductor substrate 110 and arranged at least partly in the detection region 124 of the well 120. The surface layer 210 thus is of the same doping type as the semiconductor substrate 110.

The surface layer 210 may go laterally beyond the well 120 and in this way may be directly (without a p-n junction) connected electrically to the semiconductor substrate 110 and may thus comprise the same electrical potential as the semiconductor substrate 110. A separate electrical terminal for the surface layer 210 can be saved by this.

The surface layer 210 may comprise a higher dopant concentration than the semiconductor substrate 110 in order to allow a low-resistance connection of the surface layer 210 to the semiconductor substrate 110.

By the surface layer 210, the electrostatic potential maximum is, relative to a direction vertical to the surface of the semiconductor substrate 110, placed in a distance to the surface and lies deeper in the well 120. The surface-generated dark current may, for example, be reduced significantly and a considerably improved signal-to-noise ratio may be achieved by this.

FIG. 2 shows an example where the detector terminal doping region 130 lies completely in the well and thus the terminal region 122 in its extension corresponds to the detector terminal doping region 130. Additionally, in this example the detection region 124 may be defined as that region where the surface layer 210 is located in the well. Thus, the result may exemplarily be a distance between the detection region 124 and the terminal region 122.

Figure 3:
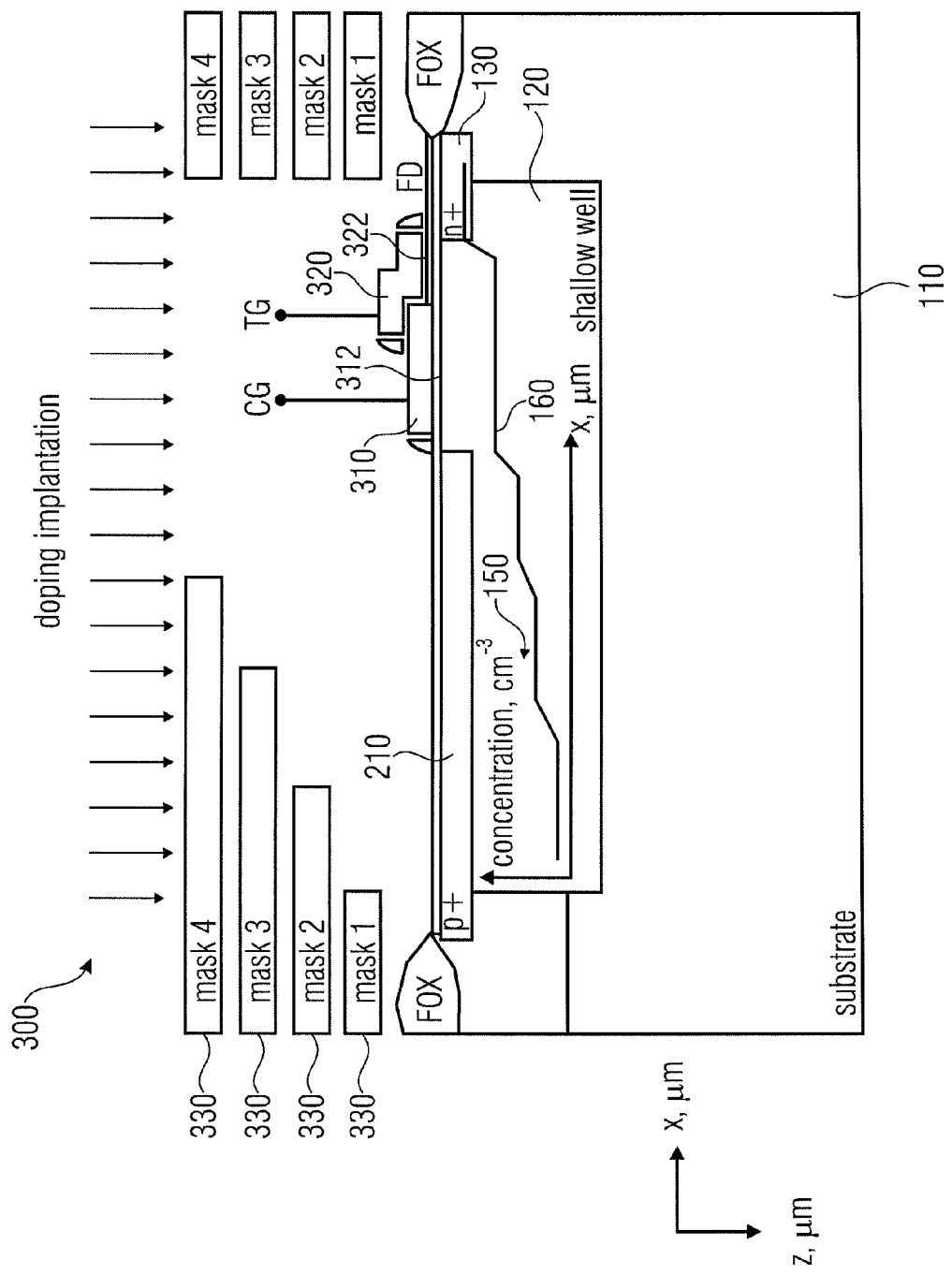
FIG. 3 shows a schematic illustration of a detector for detecting electromagnetic radiation.

FIG. 3 shows a schematic illustration of a detector 300 for detecting electromagnetic radiation in correspondence with an embodiment in accordance with the invention. The setup of the detector 300 corresponds in principle to the setup of the detector in FIG. 2, however, additionally comprises a collection control electrode or gate and a transfer control electrode or gate 320. Additionally, FIG. 3 shows a schematic illustration 150 of a potential dopant concentration course 160 and a potential realization of generating the dopant concentration course by doping implantation using different masks 330 is also indicated. Furthermore, manufacturing using field oxide (FOX) technology is indicated. Alternatively, STI (shallow trench isolation) technology, for example, may also be used. The collection control electrode or gate (CG) 310 and the transfer control electrode or gate (TG) 320 are electrically insulated from the semiconductor substrate 110 by an insulation layer 312, 322, such as, for example, by a control electron oxide.

The collection gate 310 may be arranged on the surface of the semiconductor substrate 110 between the detector terminal doping region 130 and the detection region of the detection 300. Also, the transfer gate 320 may be arranged on the surface of the semiconductor substrate 110 between the detector terminal doping region 130 and the detection region of the detector 300. The transfer gate 320 may thus be arranged at least partly between the detector terminal doping region 130 and the collection gate 310. In other words, the transfer gate 320 may be closer to the detector terminal doping region 130 than the collection gate 310. The transfer gate 320 may also extend partly over the collection gate 310, which may make manufacturing a narrow transfer gate 320 easier.

In order to optimize the transfer and readout rates and exemplarily prevent crosstalk, the collected charge carriers may be kept under the influence of an electrical field all the time. A lateral electrostatic potential gradient which may induce the collected carriers to drift to a potential maximum generated in the photodetector which may be used as a readout node is also desirable. On the other hand, the collected charge carriers should be kept deep below the silicon surface in order to reduce the dark current which is exemplarily generated by Schockley-Read-Hall recombination centers/generation centers which are located on the silicon surface and causes shot noise. The charge carriers may exemplarily also be brought to the surface only at the charge integration node where the low-frequency noise generated may exemplarily be elimination by a CDS (correlated double sampling) technique, which is allowed by the non-destructive readout explained before for PG pixel configurations. Furthermore, when an additional layer of high concentration is produced on the silicon surface, the well may be depleted completely of charge carriers by fixing the electrostatic potential in the well, and the recombination mechanisms on the silicon surface may also be supported and thus the number of charge carriers generated thermally from surface states and collected in the photodetector together with the signal carriers, be reduced. Thus, the dark current flowing in the detector may be reduced.

When using the concept described, a detector of considerably higher response rates and readout rates, and lower dark currents can be achieved. As is exemplarily shown in FIG. 3, a shallow doping well may be generated in a silicon substrate (or exemplarily an epitaxial layer), said doping well exhibiting an electrostatic potential hold voltage when same is between the substrate and a grounded layer at the surface thereof which is implanted in a highly doped manner using the same doping type as the substrate. Exemplarily, as is indicated in FIG. 3, a lateral concentration gradient in the well may at the same time be induced by a series of implantation steps using several implantation masks implanting an additional doping dose at different parts of the well. Finally, a collection gate (CG), a transfer gate (TG) and a so-called floating diffusion (SFD) which corresponds to the detector terminal doping region, which are exemplarily all part of the photodetector, as is shown in FIG. 3, may be generated.

The detector 300 shown in FIG. 3 may also be referred to a lateral drift field photodiode or a CMOS-compatible, low-noise lateral drift field photodetector of high response speed.

An aspect of the concept described is inducing an electrostatic potential gradient in the well which is generated by a concentration gradient generated there, exemplarily during well generation. A MOS (metal oxide semiconductor) capacity-based collection gate (CG) may be generated at one end of the embedded well which may be biased permanently and may induce an additional electrostatic potential maximum in the system where the photo-generated and thermally generated carriers are finally to be collected. Since the collection gate in this example is generated on the same well, it resembles a buried photo control electrode or gate, wherein the electrostatic potential maximum is distant from the silicon surface when a perpendicular section through the collection gate (CD) is made.

Figure 4:
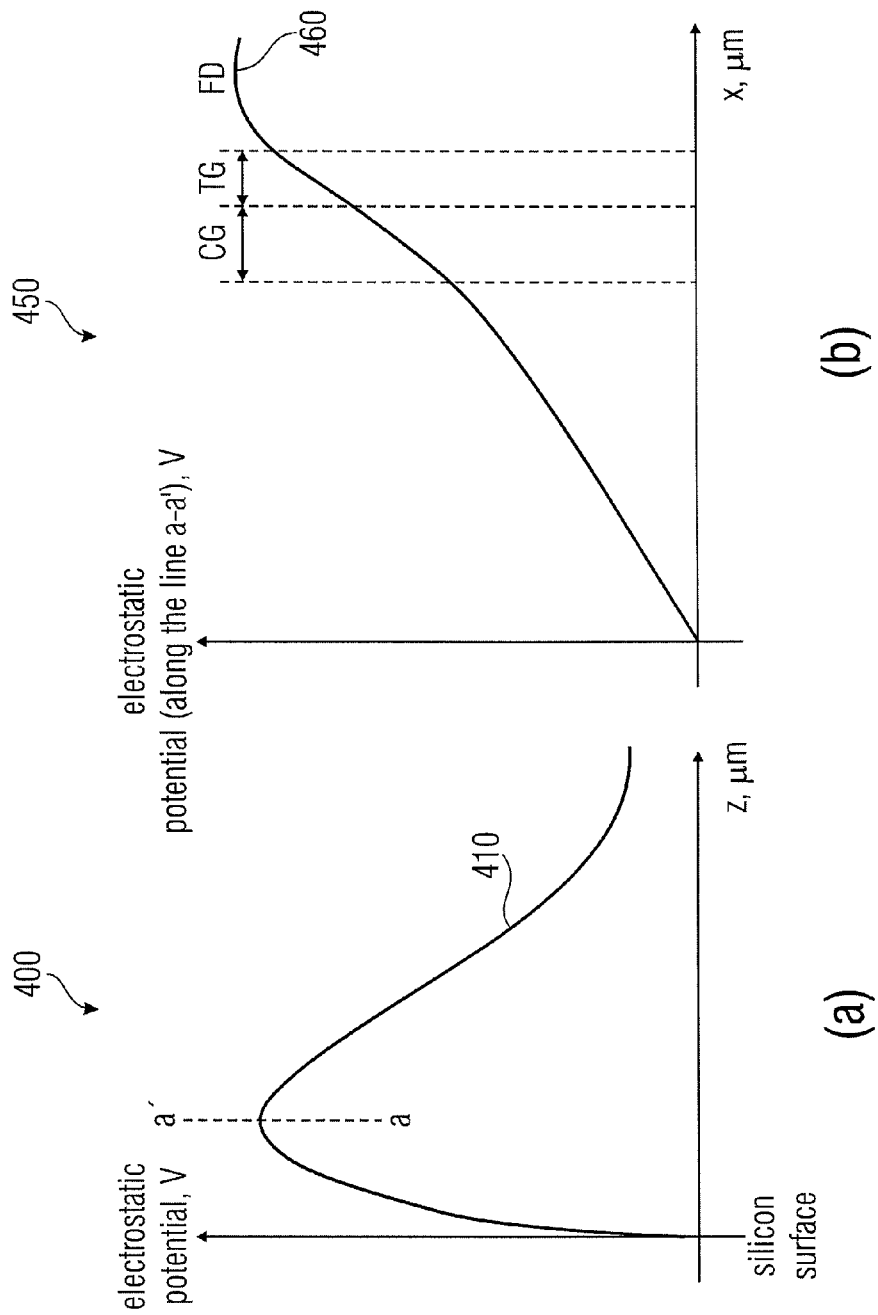

FIG. 4a shows a schematic illustration 400 of an electrostatic potential profile 410 perpendicular to the substrate surface. The course of potential 410 shows a maximum in a marked distance to the substrate surface (or to the silicon surface when a silicon wafer is used as the substrate).

Consequently, the number of charge carries which originate from the fast surface states and are mixed with the signal charge carriers already collected may be reduced. Additionally, FIG. 4b shows a schematic illustration 450 of an electrostatic potential profile 460 parallel to the substrate surface along a cross section a-a' of FIG. 4a. The electrostatic potential increases from one end of the well up to a maximum in the region of the floating diffusion (FD).

Finally, a transfer gate (TG) which may generate a potential barrier within the well which may prevent the charge collected during the charge collection cycle to be transferred to the neighboring floating diffusion (FD) may be produced, or the drift field which has all the carriers collected during the readout cycle and the reset cycle floating in the floating diffusion (FD) may be increased. The floating diffusion or the detector terminal doping region may exemplarily be used as photodetector readout nodes and/or photodetector reset nodes.

In several embodiments in accordance with the invention, a depletion region reaching relatively deep into the substrate (depending on the electrostatic potential induced in the well) is generated in the well described before, which may be of particular importance, for example for radiation detection in the near infrared (NIR) range, which is normally used in, for example, time-of-flight (ToF) 3D imaging applications, since an increased number of photo-generated charge carriers is instantly drifted to the electrostatic potential maximum which is induced in the well described (see, for example, FIG. 4a).

On the other hand, when the minority charge carriers are separated from the majority charge carriers due to the effects of the electrical field induced, the minority charge carriers will instantly drift to the local electrostatic potential maximums in the well or at the collection gate (CG), as is shown in FIG. 4a, and, subsequently or simultaneously, laterally further to the electrostatic system potential maximum which is exemplarily located below the collection gate (or in the floating diffusion region), as is shown in FIG. 4b. This means that, in contrast to what happens in surface channel detectors or even buried channel photo gate detectors (PG), charge-coupled detectors (CCD) or even pinned photodiodes (PPD), where the charge transfer depends primarily on thermal diffusion and fringe-field mechanisms, the charge transport in this solution may almost completely be dependent on drift mechanisms.

Additionally, although the fringe fields may be sufficient to achieve acceptable response speeds of photodetectors of areas of 2 $\mu m^2$, 4 $\mu m^2$ or even 9 $\mu m^2$, the response speed of these detectors will, for photoactive regions greater than same, decrease proportional to the reduction (of the fields) in the photoactive region. This is not the case in the solution shown in FIG. 3, for example, since the lateral concentration gradient in the well generated may be optimized such that a lateral drift field needed may be induced in the detector.

Additionally, the overall well capacity problems of PG, CCD and PPD pixel structures, which are normally present, can be solved partly by an appropriate design of the collection gate (CG), the floating diffusion (FD) and by an appropriate biasing thereof as soon as the photodetector has been produced, since the charge is, for example, actually collected below the collection gate (CG) and finally read out via the floating diffusion.

The signal-to-noise ratio in the detector described may be improved further by using special readout techniques, such as, for example, charge accumulation multiple readout averaging, special CDS applications or in-pixel signal processing.

The concept described exemplarily allows an ultra-low-noise and many versatile CMOS-compatible photodetector solutions of high response speed and the greatest possible photoactive region.

In some embodiments in accordance with the invention, versatile advantages result for a photodetector having lateral drift fields which may be induced by the well production. A lateral electrostatic potential gradient existing, which is induced by a doping concentration gradient in a photodetector, may make the drift mechanism the dominating mechanism over the diffusion mechanism during the charge transfer phase and the readout phase. This means that the response speed of the photodetector is improved significantly in this way, compared to known solutions.

The grounded, highly doped layer (of the same type as the silicon substrate on which the photodetector is produced) present on the diffused shallow well (see, for example, FIG. 3) pushes the electrostatic potential maximum away from the silicon surface (see, for example, FIG. 4a) and improves the recombination mechanism on the substrate surface. These two effects may reduce the surface-generated dark current component of the photodetector and the amount of ENC, which, compared to known solutions, provides a considerably improved signal-to-noise ratio.

The "buried" collection gate (CG) and transfer gate (TG) may collect and transport the charge collected at a place deep below the silicon/oxide interface (substrate surface), which may exemplarily reduce reset noise which normally forms in the channel in surface PG detectors, which, compared to known solutions, provides a much better signal-to-noise ratio (SNR).

The overall well capacity or the maximum amount of collected charges possible may depend on the collection gate (CG) and the floating diffusion (FD), on an appropriate design thereof for optimizing these characteristics and on the external biasing thereof, and no longer on the characteristics of the shallow well, which normally is the problem in known solutions.

The dynamic range (DR) and the signal-to-noise ratio may exemplarily be improved by multiple charge transfer accumulation, without additionally adding read noise to the pixel output.

Some embodiments in accordance with the invention relate to applications of low-noise CMOS high-speed lateral drift field photodetectors having large photoactive regions in three-dimensional inspection/position systems, vehicle image systems, such as, for example, for monitoring in a vehicle, airbag control systems, vehicle security, street course recognition, sensors for an early detection of accidents, pedestrian protection or self-parking systems, in topographical applications, in communications technology, in general monitoring systems, in medical imaging, in scientific imaging applications or video games and entertainment.

In some embodiments the inherent existing potential gradient of the well may be induced by another effect than an increasing dopant concentration. In other words, a detector for detecting electromagnetic radiation may comprise a semiconductor substrate of a first doping type and a well in the semiconductor substrate, the well being of a second doping type, the first doping type and the second doping type being different, wherein the well comprises an increasing inherent existing potential gradient in a direction parallel to a surface of a semiconductor substrate. Further the detector may comprise a detector terminal doping region which is arranged at least partly in the well in a terminal region of the well, the detector terminal doping region being of the same doping type as the well, wherein the detection of electromagnetic radiation is based on a generation of free charge carriers by the electromagnetic radiation in a detection region of the well which comprises a maximum dopant concentration which is lower than a maximum dopant concentration of the terminal region of the well. The inherent existing potential gradient of the well may increase monotonically in the direction parallel to the surface of the semiconductor substrate in a region between one end of the detection region facing away from the terminal region and one end of the terminal region facing away from the detection region. Additionally the detector may comprise a transfer control electrode for controlling a transfer of free charge carriers in a region of the well, the transfer control electrode being arranged on the surface of the semiconductor substrate in a region of the well between the detector terminal doping region and the detection region, an electrically insulting layer being arranged between the semiconductor substrate and the transfer control electrode. Further the detector may comprise a collection control electrode for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

Figure 5:
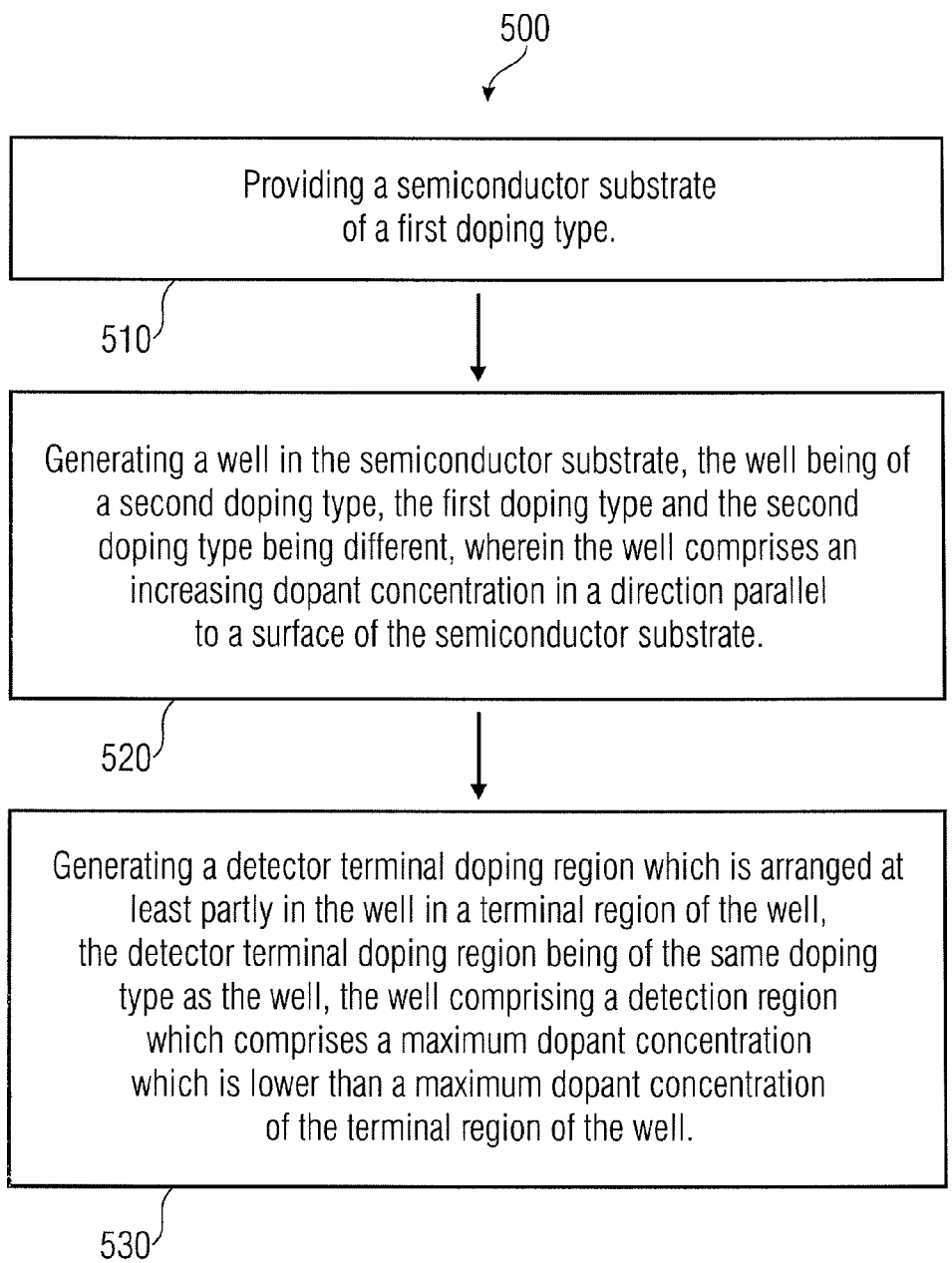
FIG. 5 shows a flow chart of a method for producing a detector.
Figure 7:
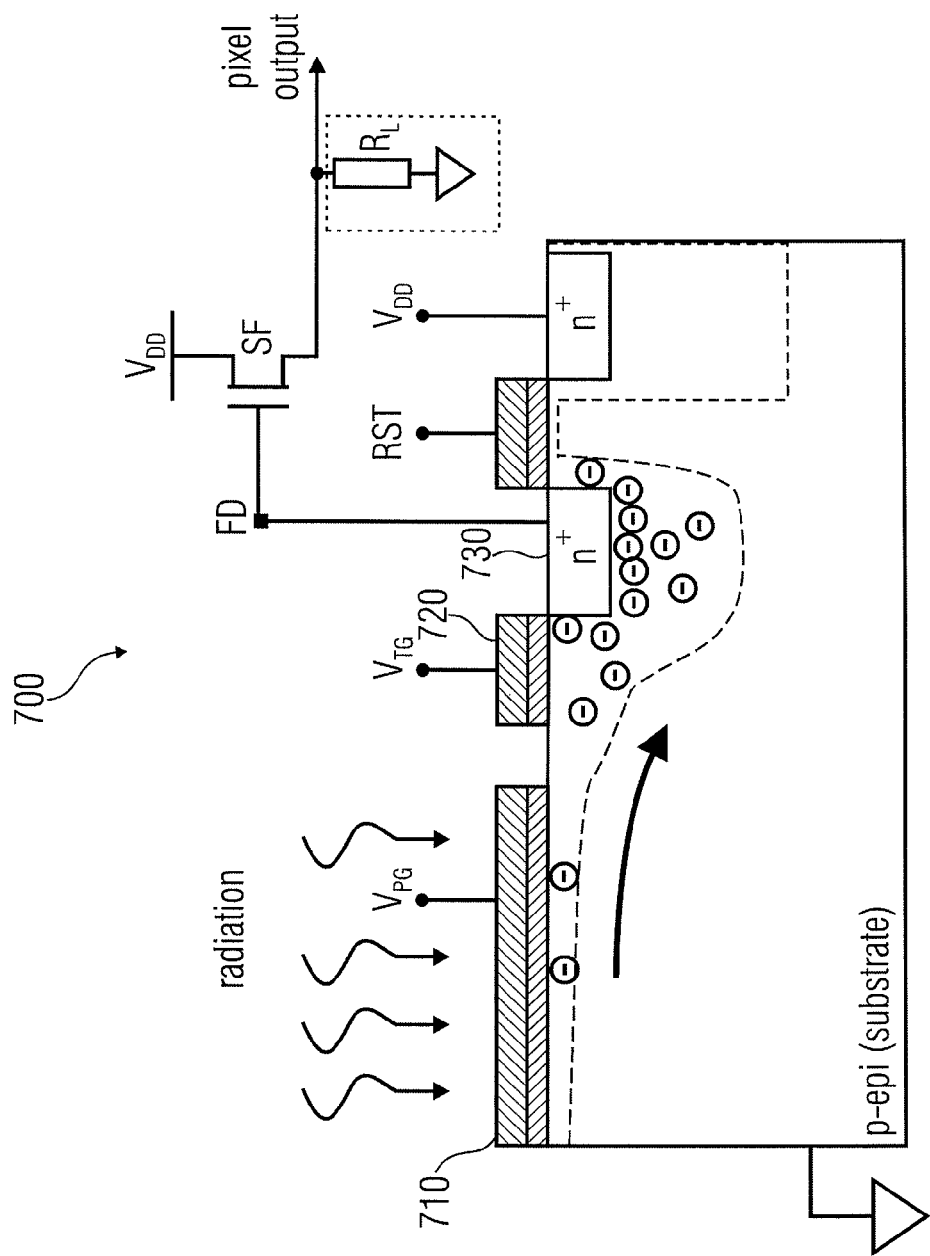
FIG. 7 shows a schematic illustration of a known detector.
Figure 8:
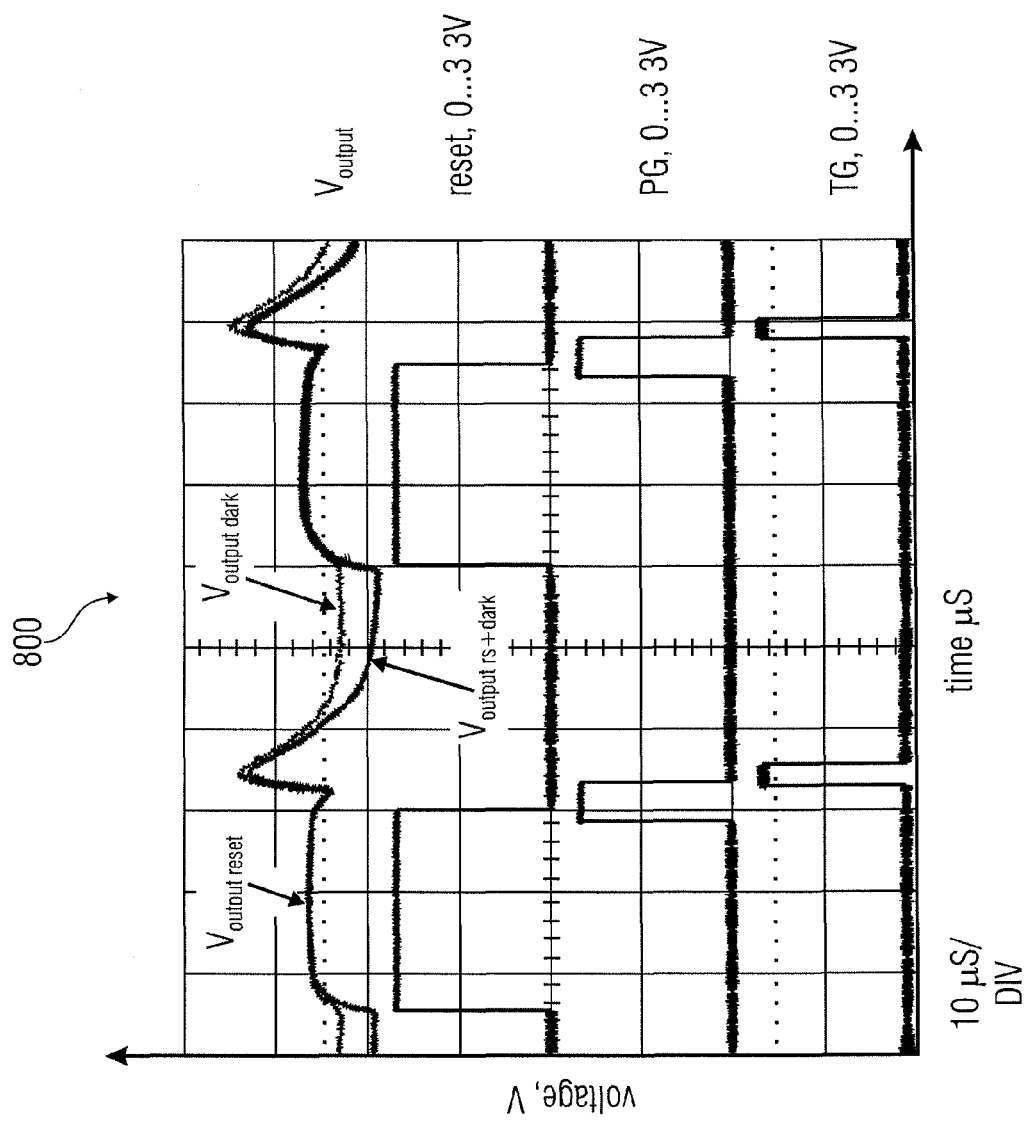
FIG. 8 shows a schematic illustration of an oscilloscope graph of signals of the detector of FIG. 7.

FIG. 5 shows a flow chart of a method 500 for producing a detector in correspondence with an embodiment in accordance with the invention. The method 500 includes providing 510 a semiconductor substrate of a first doping type, and generating 520 a well in the semiconductor substrate, the well being of a second doping type. The first doping type and the second doping type are different and the well has an increasing dopant concentration in a direction parallel to a surface of a semiconductor substrate. Furthermore, the method includes generating 630 a detector terminal doping region which is arranged at least partly in the well in a terminal region of the well, the detector terminal doping region being of the same doping type as the well. The well comprises a detection region having a maximum dopant concentration which is lower than a maximum dopant concentration of the terminal region of the well.

FIG. 6 shows a flow chart of a method 600 for detecting electromagnetic radiation in correspondence with an embodiment in accordance with the invention. The method 600 includes generating 610 free charge carriers by the electromagnetic radiation in a detection region of a well, the well being arranged in a semiconductor substrate. The semiconductor substrate is of a first doping type and the well is of a second doping type, the first doping type and the second doping type being different. The well comprises an increasing dopant concentration in a direction parallel to a surface of the semiconductor substrate. The detection region of the well has a maximum dopant concentration which is lower than a maximum dopant concentration of a terminal region of the well. Additionally, the method 600 includes collecting 620 the free charge carriers in a detector terminal doping region which is arranged at least partly in the well in the terminal region of the well, the detector terminal doping region being of the same doping type as the well. Detecting the electromagnetic radiation is based on collecting 620 the free charge carriers.

It is particularly pointed out here that, depending on the circumstances, the inventive scheme may be implemented in software, too. The implementation may be on a digital storage medium, in particular on a disk or a CD having control signals which may be read out electronically, which can cooperate with a programmable computer system such that the corresponding method will be executed. Generally, the invention is also in a computer program product having a program code stored on a machine-readable carrier for performing the inventive method when the computer program product runs on a computer. Expressed in other words, the invention may also be realized as a computer program having a program code for performing the method when the computer program product runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A detector for detecting electromagnetic radiation, comprising:
   a semiconductor substrate of a first doping type;
   a well in the semiconductor substrate, the well being of a second doping type, the first doping type and the second doping type being different, wherein the well comprises an increasing dopant concentration in a direction parallel to a surface of a semiconductor substrate;
   a detector terminal doping region which is arranged at least partly in the well in a terminal region of the well, the detector terminal doping region being of the same doping type as the well, wherein the detection of electromagnetic radiation is based on a generation of free charge carriers by the electromagnetic radiation in a detection region of the well which comprises a maximum dopant concentration which is lower than a maximum dopant concentration of the terminal region of the well,
   wherein the dopant concentration of the well increases monotonically in the direction parallel to the surface of the semiconductor substrate in a region between one end of the detection region facing away from the terminal region and one end of the terminal region facing away from the detection region;
   a transfer control electrode for controlling a transfer of free charge carriers in a region of the well, the transfer control electrode being arranged on the surface of the semiconductor substrate in a region of the well between the detector terminal doping region and the detection region, an electrically insulating layer being arranged between the semiconductor substrate and the transfer control electrode; and
   a collection control electrode for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

2. The detector in accordance with claim 1, comprising a surface layer which is at least partly overlapped by the detection region of the well, on the surface of the semiconductor substrate, the surface layer being of the same doping type as the semiconductor substrate.

3. The detector in accordance with claim 2, wherein the surface layer comprises a higher dopant concentration than the semiconductor substrate.

4. The detector in accordance with claim 2, wherein the surface layer extends laterally beyond the well.

5. The detector in accordance with claim 1, wherein the well comprises a highest dopant concentration of the well in the terminal region.

6. The detector in accordance with claim 1, wherein the detector terminal doping region comprises a maximum dopant concentration which is higher than a maximum dopant concentration of the well.

7. A detector for detecting electromagnetic radiation, comprising:
  a semiconductor substrate of a first doping type;
  a well in the semiconductor substrate, the well being of a second doping type, the first doping type and the second doping type being different, wherein the well comprises an increasing inherent existing potential gradient in a direction parallel to a surface of a semiconductor substrate;
  a detector terminal doping region which is arranged at least partly in the well in a terminal region of the well, the detector terminal doping region being of the same doping type as the well, wherein the detection of electromagnetic radiation is based on a generation of free charge carriers by the electromagnetic radiation in a detection region of the well which comprises a maximum dopant concentration which is lower than a maximum dopant concentration of the terminal region of the well,
  wherein the inherent existing potential gradient of the well increases monotonically in the direction parallel to the surface of the semiconductor substrate in a region between one end of the detection region facing away from the terminal region and one end of the terminal region facing away from the detection region;
  a transfer control electrode for controlling a transfer of free charge carriers in a region of the well, the transfer control electrode being arranged on the surface of the semiconductor substrate in a region of the well between the detector terminal doping region and the detection region, an electrically insulating layer being arranged between the semiconductor substrate and the transfer control electrode; and
  a collection control electrode for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

8. A method for producing a detector, comprising:
  providing a semiconductor substrate of a first doping type;
  generating a well in the semiconductor substrate, the well being of a second doping type, the first doping type and the second doping type being different, wherein the well comprises an increasing dopant concentration in a direction parallel to a surface of the semiconductor substrate;
  generating a detector terminal doping region which is arranged at least partly in the well in a terminal region of the well, the detector terminal doping region being of the same doping type as the well, the well comprising a detection region which comprises a maximum dopant concentration which is lower than a maximum dopant concentration of the terminal region of the well,
  wherein the dopant concentration of the well increases monotonically in the direction parallel to the surface of the semiconductor substrate in a region between one end of the detection region facing away from the terminal region and one end of the terminal region facing away from the detection region;
  generating a transfer control electrode for controlling a transfer of free charge carriers in a region of the well, the transfer control electrode being arranged on the surface of the semiconductor substrate in a region of the well between the detector terminal doping region and the detection region, an electrically insulating layer being arranged between the semiconductor substrate and the transfer control electrode; and
  generating a collection control electrode for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

9. A method for detecting electromagnetic radiation, comprising:
  generating free charge carriers by the electromagnetic radiation in a detection region of a well, the well being arranged in a semiconductor substrate, the semiconductor substrate being of a first doping type and the well being of a second doping type, the first doping type and the second doping type being different, wherein the well comprises an increasing dopant concentration in a direction parallel to a surface of the semiconductor substrate, and wherein the detection region of the well comprises a maximum dopant concentration which is lower than a maximum dopant concentration of a terminal region of the well; and
  collecting the free charge carriers in a detector terminal doping region which is arranged at least partly in the well in the terminal region of the well, the detector terminal doping region being of the same doping type as the well, wherein detecting the electromagnetic radiation is based on collecting the free charge carriers,
  wherein the dopant concentration of the well increases monotonically in the direction parallel to the surface of the semiconductor substrate in a region between one end of the detection region facing away from the terminal region and one end of the terminal region facing away from the detection region,
  wherein a transfer control electrode is configured for controlling a transfer of free charge carriers in a region of the well, the transfer control electrode being arranged on the surface of the semiconductor substrate in a region of the well between the detector terminal doping region and the detection region, an electrically insulating layer being arranged between the semiconductor substrate and the transfer control electrode, and
  wherein a collection control electrode is configured for collecting free charge carriers in a region of the well, the collection control electrode being arranged on the surface of the semiconductor substrate in a region of the well between the detector terminal doping region and the detection region, an electrically insulating layer being arranged between the semiconductor substrate and the collection control electrode, the transfer control electrode being arranged at least partly between the collection control electrode and the detector terminal doping region.

* * * * *

UNITED STATES PATENT AND TRADEMARK OFFICE
CERTIFICATE OF CORRECTION

PATENT NO. : 8,324,549 B2
APPLICATION NO. : 12/775204
DATED : December 4, 2012
INVENTOR(S) : Daniel Durini Romero, Wener Brockherde and Bedrich Hosticka Page 1 of 1

It is certified that error appears in the above-identified patent and that said Letters Patent is hereby corrected as shown below:

On page 1, item [75], Inventors, the name of the first inventor Daniel Durini Romero should read -- Daniel DURINI ROMERO --.

Signed and Sealed this
Nineteenth Day of February, 2013

Teresa Stanek Rea
*Acting Director of the United States Patent and Trademark Office*